United States Patent
Kasat et al.

(10) Patent No.: US 11,630,935 B1
(45) Date of Patent: Apr. 18, 2023

(54) DATA TRAFFIC INJECTION FOR SIMULATION OF CIRCUIT DESIGNS

(71) Applicant: Xilinx, Inc., San Jose, CA (US)

(72) Inventors: Amit Kasat, Hyderabad (IN); Tharun Kumar Ksheerasagar, Telangana (IN); Hemant Kashyap, Hyderabad (IN); Madhusudana Reddy, Hyderabad (IN); Rohit Bhadana, Faridabad (IN)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 17/498,048

(22) Filed: Oct. 11, 2021

(51) Int. Cl.
| | |
|---|---|
| *G06F 30/30* | (2020.01) |
| *G01R 31/28* | (2006.01) |
| *G06F 30/3308* | (2020.01) |
| *G06F 30/323* | (2020.01) |
| *G01R 31/3183* | (2006.01) |

(52) U.S. Cl.
CPC ........ *G06F 30/3308* (2020.01); *G06F 30/323* (2020.01); *G01R 31/2848* (2013.01); *G01R 31/318364* (2013.01)

(58) Field of Classification Search
None
See application file for complete search history.

(56) References Cited

U.S. PATENT DOCUMENTS

| | | | |
|---|---|---|---|
| 7,197,445 B1 | 3/2007 | Deepak et al. | |
| 7,302,377 B1 | 11/2007 | Deepak | |
| 7,330,808 B1 | 2/2008 | Jorgensen et al. | |
| 7,451,417 B1 | 11/2008 | Campbell | |
| 7,590,137 B1 | 9/2009 | Chan | |
| 7,636,653 B1 | 12/2009 | Chan | |
| 7,673,201 B1 | 3/2010 | Chan | |
| 7,707,019 B1 | 4/2010 | Ballagh et al. | |
| 7,721,090 B1 | 5/2010 | Deepak et al. | |
| 7,739,092 B1 | 6/2010 | Ballagh et al. | |
| 7,895,026 B1 | 2/2011 | Kelly et al. | |
| 7,930,162 B1 | 4/2011 | Chan et al. | |
| 8,020,124 B2 * | 9/2011 | Alexanian | G01R 31/318314 716/108 |
| 8,041,553 B1 | 10/2011 | Hernandez et al. | |
| 8,074,077 B1 | 12/2011 | Neema et al. | |

(Continued)

*Primary Examiner* — Leigh M Garbowski
(74) *Attorney, Agent, or Firm* — Kevin T. Cuenot

(57) ABSTRACT

Computer-based simulation of a device under test (DUT) corresponding to a user circuit design includes providing an adapter configured to couple to the DUT during the computer-based simulation (simulation). The adapter is configured to translate incoming high-level programming language (HLPL) transactions into DUT compatible data for conveyance to the DUT and translate DUT compatible data generated by the DUT to outgoing HLPL transactions. A communication server is provided that couples to the adapter during the simulation. The communication server is configured to exchange the incoming and outgoing HLPL transactions with an entity executing external to the simulation. A communication layer client is provided that is configured to execute external to the simulation and exchange the incoming and outgoing HLPL transactions with the communication server. The communication layer client provides an application programming interface through which an external computer program generates data traffic to drive the DUT within the simulation.

20 Claims, 7 Drawing Sheets

(56) References Cited

U.S. PATENT DOCUMENTS

| | | | |
|---|---|---|---|
| 8,150,638 B1 | 4/2012 | Wu et al. | |
| 8,195,441 B1 | 6/2012 | Ou et al. | |
| 8,352,229 B1 | 1/2013 | Ma et al. | |
| 8,769,448 B1 | 7/2014 | Sundararajan et al. | |
| 9,117,043 B1 | 8/2015 | Huang et al. | |
| 9,223,910 B1 | 12/2015 | Ghosh et al. | |
| 9,811,618 B1 | 11/2017 | Parekh et al. | |
| 10,289,779 B2 * | 5/2019 | Wolff | G06F 13/42 |
| 10,296,673 B1 | 5/2019 | Ghosh et al. | |
| 10,437,946 B1 | 10/2019 | Kasat et al. | |
| 10,437,949 B1 | 10/2019 | Mihalache et al. | |
| 10,521,544 B2 * | 12/2019 | Suresh | G06F 11/2733 |
| 10,671,785 B1 | 6/2020 | Mihalache et al. | |
| 10,678,976 B2 * | 6/2020 | Ali | G06F 30/331 |
| 2002/0169815 A1 * | 11/2002 | Wong | G06F 30/33 |
| | | | 714/E11.167 |

* cited by examiner

300

302
Provide an adapter configured to couple to the DUT during the computer-based simulation, wherein the adapter is configured to translate incoming high-level programming language (HLPL) transactions into DUT compatible data for conveyance to the DUT over a first channel and translate DUT compatible data generated by the DUT and conveyed from the DUT over a second channel to outgoing HLPL transactions

304
Provide a communication server that couples to the adapter during the computer-based simulation, wherein the communication server is configured to exchange the incoming and outgoing HLPL transactions with one or more entities executing external to the computer-based simulation

306
Provide a communication layer client configured to execute external to the computer-based simulation and exchange the incoming and outgoing HLPL transactions with the communication server, wherein the communication layer client provides an application programming interface through which an external computer program generates data traffic to drive the DUT within the computer-based simulation.

FIG. 3

DATA TRAFFIC INJECTION FOR SIMULATION OF CIRCUIT DESIGNS

TECHNICAL FIELD

This disclosure relates to integrated circuits (ICs). More particularly, this disclosure relates to data traffic injection for simulation of circuit designs for implementation within an IC.

BACKGROUND

Computer-based simulation is a valuable tool for verifying the functionality of circuit designs and ensuring that circuit designs are likely to meet established design requirements. Computer-based simulation allows such verification without first having to implement the circuit design within an integrated circuit (IC). Modern ICs and acceleration platforms include a rich set of ports for communicating among different systems. These ports include internal ports through which one or more circuit blocks and/or subsystems (e.g., a device under test or "DUT") may communicate with other circuit blocks and/or subsystems of the IC. These ports also include input/output (I/O) ports through which the DUT may communicate with circuits and/or systems external to the IC or external to the acceleration platform on which the IC is disposed.

Available computer-based simulation systems are restrictive in terms of the way that data traffic may be emulated. Often, data to be provided to a DUT is stored in a memory model (e.g., a data structure) representing a random-access memory (RAM) such as a Dynamic Random-Access Memory (DRAM). The DUT reads the data from the memory model. Such approaches, however, are unable to model or mimic realistic operating scenarios encountered in the field thereby resulting in inaccurate simulation.

SUMMARY

One or more example implementations include a method of computer-based simulation of a device under test (DUT) corresponding to a user circuit design. The method includes providing an adapter configured to couple to the DUT during the computer-based simulation. The adapter is configured to translate incoming high-level programming language (HLPL) transactions into DUT compatible data for conveyance to the DUT over a first channel and to translate DUT compatible data generated by the DUT and conveyed from the DUT over a second channel to outgoing HLPL transactions. The method includes providing a communication server that couples to the adapter during the computer-based simulation. The communication server is configured to exchange the incoming and outgoing HLPL transactions with one or more entities executing external to the computer-based simulation. The method includes providing a communication layer client configured to execute external to the computer-based simulation and exchange the incoming and outgoing HLPL transactions with the communication server. The communication layer client provides an application programming interface through which an external computer program generates data traffic to drive the DUT within the computer-based simulation.

One or more example implementations includes a system for computer-based simulation of a DUT corresponding to a user circuit design. The system includes one or more processors configured to initiate operations. The operations include executing an adapter configured to couple to the DUT during the computer-based simulation. The adapter is configured to translate incoming HLPL transactions into DUT compatible data for conveyance to the DUT over a first channel and to translate DUT compatible data generated by the DUT and conveyed from the DUT over a second channel to outgoing HLPL transactions. The operations include executing a communication server that couples to the adapter during the computer-based simulation. The communication server is configured to exchange the incoming and outgoing HLPL transactions with one or more entities executing external to the computer-based simulation. The operations include executing a communication layer client external to the computer-based simulation. The communication layer client is configured to exchange the incoming and outgoing HLPL transactions with the communication server and provide an application programming interface through which an external computer program generates data traffic to drive the DUT within the computer-based simulation.

In one or more example implementations, a computer program product includes one or more computer readable storage media, and program instructions collectively stored on the one or more computer readable storage media. The program instructions are executable by computer hardware to initiate operations. The operations can include implementing an adapter configured to couple to the DUT during the computer-based simulation. The adapter is configured to translate incoming HLPL transactions into DUT compatible data for conveyance to the DUT over a first channel and to translate DUT compatible data generated by the DUT and conveyed from the DUT over a second channel to outgoing HLPL transactions. The operations include implementing a communication server that couples to the adapter during the computer-based simulation. The communication server is configured to exchange the incoming and outgoing HLPL transactions with one or more entities executing external to the computer-based simulation. The operations include implementing a communication layer client external to the computer-based simulation. The communication layer client is configured to exchange the incoming and outgoing HLPL transactions with the communication server and provide an application programming interface through which an external computer program generates data traffic to drive the DUT within the computer-based simulation.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

FIG. 3 is an example method of computer-based simulation of a DUT corresponding to a user circuit design according to one or more embodiments of the present invention.

DETAILED DESCRIPTION

This disclosure relates to integrated circuits (ICs). More particularly, this disclosure relates to data traffic injection for simulation of circuit designs for implementation within an IC. In accordance with the inventive arrangements described within this disclosure, methods, systems, and computer-program products for computer-based simulation of circuit designs are provided that support data traffic injection over a variety of different types of ports. The inventive arrangements support the generation of custom data traffic to a Device Under Test (DUT) within a computer-based simulation environment by way of an external computer program executing in coordination with the simulation environment and DUT.

The external computer program may be any of a variety of different computer programs such as models, testbenches, interpreters capable of executing scripts, another simulation and/or simulation process, or the like. The external computer program executes outside of, or separately from, the computer-based simulation environment. For example, the external computer program may execute in a different process than the simulation. Though external, the external computer program is capable of coordinated execution with the simulation. The external computer program may be implemented in any of a variety of different types of programming languages despite the particular type of simulation environment and/or DUT being used. Using an external computer program for data traffic generation in coordination with the simulation architecture described herein provides increased flow control over the data traffic and increased control over timing of the data traffic. Use of the external computer program(s) facilitates hardware-like execution of the behavior of the DUT during simulation by modeling or mimicking realistic scenarios for more accurate simulation than would otherwise be the case. Further aspects of the inventive arrangements are described below with reference to the figures.

Figure 1A:
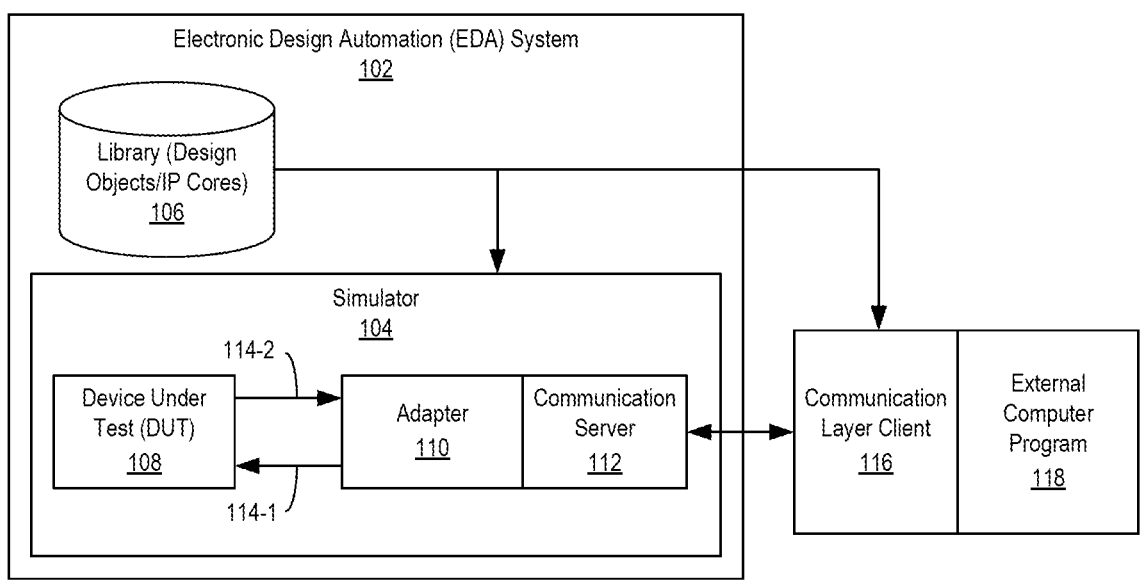
FIG. 1A illustrates an example of a computer-based simulation environment.

FIG. 1A illustrates an example of a computer-based simulation environment 100. Computer-based simulation environment 100 includes an Electronic Design Automation (EDA) system 102. EDA system 102 may be executed by a data processing system. An example of a data processing system is described herein in connection with FIG. 5.

EDA system 102 may include a simulator 104 and a library 106 that stores various design objects and/or Intellectual Property (IP) cores. Though shown as being integrated with EDA system 102, in one or more other example implementations, simulator 104 and/or library 106 may be implemented independently of EDA system 102 and operate cooperatively therewith. Simulator 104 may include a DUT 108. DUT 108 may be a user circuit design, e.g., a kernel, specifying a particular function or functions to be realized in hardware. In one aspect, DUT 108 is specified in a hardware description language (HDL).

As defined herein, the term "hardware description language" or "HDL" is a computer-language that facilitates the documentation, design, and manufacturing of a digital system, such as an integrated circuit. An HDL is expressed in human readable form and combines program verification techniques with expert system design methodologies. Using an HDL, for example, a user can design and specify an electronic circuit, describe the operation of the circuit, and create tests to verify operation of the circuit. An HDL includes standard, text-based expressions of the spatial and temporal structure and behavior of the electronic system being modeled. HDL syntax and semantics include explicit notations for expressing concurrency.

In contrast to most high-level programming languages, an HDL also includes an explicit notion of time, e.g., clocks and/or clock signals, which is a primary attribute of a digital system. For example, an HDL design may describe the behavior of a circuit design as data transfers occur between registers each clock cycle. Examples of HDLs may include, but are not limited to, Verilog and VHDL. HDLs are sometimes referred to as register transfer level (RTL) descriptions of circuit designs and/or digital systems. Both Verilog and VHDL support the ability to specify attributes on modules in their native syntax.

In another aspect, DUT 108 may be specified as a high-level programming language (HLPL). As defined herein, the term "high-level programming language" or "HLPL" means a programming language, or set of instructions, used to program a data processing system where the instructions have a strong abstraction from the details of the data processing system, e.g., machine language. For example, a high-level programming language may automate or hide aspects of operation of the data processing system such as memory management. The amount of abstraction typically defines how "high-level" the programming language is. Using a high-level programming language frees the user from dealing with registers, memory addresses, and other low-level features of the data processing system upon which the high-level programming language will execute. In this regard, a high-level programming language may include little or no instructions that translate directly, on a one-to-one basis, into a native opcode of a central processing unit (CPU) of a data processing system. Examples of high-level programming languages include, but are not limited to, C, C++, SystemC, OpenCL C, or the like. SystemC, though specified as a high-level programming language, does include the notion of time and concurrency similar to an HDL.

An adapter 110 is included and is configured to couple to DUT 108 during a computer-based simulation performed by simulator 104. Adapter 110, for example, is configured to translate incoming HLPL transactions into DUT compatible data for conveyance to DUT 108 over a first channel 114-1. Adapter 110 is also configured to translate DUT compatible data generated by DUT 108 and conveyed from DUT 108 over a second channel 114-2 to outgoing HLPL transactions.

In one aspect, where DUT 108 is specified using an HDL, the DUT compatible data may be HDL signals (e.g., RTL signals). Data conveyed as HDL signals during simulation may be represented on a per wire or signal basis and may be conveyed in a cycle accurate manner with reference to a simulation clock. In another aspect, where DUT 108 is specified in an HLPL, e.g., as a C/C++ model and/or a SystemC model, the DUT compatible data may be specified as HLPL transactions. HLPL transactions may be used, for example, in cases where DUT 108 is a transaction level model (TLM) as opposed to a cycle accurate model. In the case of a transaction level model, the HLPL transactions may be conveyed as a function call.

A communication server 112 may also be provided. Communication server 112 may be executed by simulator 104. As defined herein, the term "server" means a computer program executed by a data processing system, e.g., a computer, that is configured to share services with one or more external computer programs. For example, communication server 112 is capable of communicating with one or more adapters 110 and one or more external computer programs 118 via their corresponding communication layer clients 116.

Communication server 112 couples to adapter 110 during the computer-based simulation. Communication server 112 is configured to exchange the incoming and outgoing HLPL transactions with one or more entities executing external to the computer-based simulation. A communication layer client 116 is also provided. Communication layer client 116 is configured to execute external to the computer-based simulation and exchange the incoming and outgoing HLPL transactions with communication server 112. Communication layer client 116 provides Application Programming Interfaces (APIs) through which an external computer program such as external computer program 118 generates data traffic to drive DUT 108 within the computer-based simulation.

Data traffic is data provided from an external computer program to a DUT. The external computer program may represent one or more other circuits and/or systems disposed in the same IC as the DUT or one or more other circuits and/or systems external to the IC in which the DUT is implemented. Data traffic may be expressed as a pattern, e.g., a "data traffic pattern." As such, the term data traffic refers to the data that is provided, the quantity of the data that is exchanged, the format of the data that is exchanged, and the timing of the data that is exchanged. The data generated by a DUT in response to data traffic may be referred to a type of data traffic such as a response or response data traffic.

Simulator 104 is executed by a data processing system. Simulator 104 may be included within EDA system 102 as illustrated or implemented independently of EDA system 102. In one aspect, simulator 104 is implemented as an event-based simulator. An event-based simulator typically refers to a simulator capable of executing a user circuit design where events occur at particular instances of time. For example, events may correspond to clock cycles where changes in the state of the user circuit design may be evaluated in response to each event or clock cycle. An example of an event-based simulator is an HDL simulator where a user circuit design is compiled into an executable model. The resulting executable model of the user circuit design is executed in combination with simulator 104. In this regard, HDL simulation generally includes two phases. The first phase is referred to as compilation. During compilation, DUT 108 is parsed, elaborated, and executable program code is generated from DUT 108. The second phase is a runtime phase where the executable program code generated during compilation is loaded into memory of the data processing system and executed. For purposes of illustration, DUT 108 may refer to the user circuit design and/or the executable program code generated from the user circuit design.

In another aspect, simulator 104 may be implemented as a functional simulator. A functional simulator is capable of executing a DUT specified in a high-level language such as SystemC or the like. The user circuit design still is compiled into an executable model. The simulator, however, does not utilize events occurring at particular instances of time. As such, while functional simulation generates functionally correct results, the functional simulator does not produce cycle accurate simulation results.

In an example implementation, adapter 110 and communication server 112 are instantiated within a design environment provided through execution of EDA system 102. Adapter 110 couples to DUT 108. In one aspect, adapter 110 and communication server 112 may be instantiated within the design environment as a design object or as an IP core from library 106. Library 106 may be implemented as a database or data repository storing one or more of various design objects and/or IP cores. Adapter 110 may be instantiated to couple to DUT 108 by way of one or more channels 114. Within this disclosure, channels 114 are illustrated as unidirectional channels (e.g., where DUT 108 has an input channel 114-1 and an output channel 114-2). In other example implementations, a channel of DUT 108 may be represented as a bidirectional channel. Further, though DUT 108 is shown to include one input channel and one output channel, it should be appreciated that DUT 108 may include one more input channels and/or one or more output channels. The particular number of channels included depends on the particular DUT that is simulated.

In one example, each of channels 114 may represent a unidirectional, point-to-point communication link corresponding to an Advanced Microcontroller Bus Architecture (AMBA) eXtensible Interface (AXI) (hereafter "AXI") stream channel. In another example, channels 114 may represent memory mapped AXI channels. In still other examples, channels 114 may represent a communication bus such as a Peripheral Component Interconnect Express (PCIe) bus, or other communication channel having a defined architecture and/or communication protocol. The example types of protocols described herein that may be simulated by channels 114 are provided for purposes of illustration only and are not intended to be limiting of the inventive arrangements described.

In an example implementation, adapter 110 and communication server 112 may be instantiated as part of a design flow for DUT 108. For example, the user may input a command via a command line of EDA system 102 that instantiates adapter 110 and communication server 112 within the design environment with DUT 108. The command may indicate the particular ports of DUT 108 to which adapter 110 are to connect (e.g., the ports coupled to channels 114).

In one aspect, the ports of DUT 108 are intended to connect to, or communicate with, systems that are external to the IC in which DUT 108 is to be implemented. In that case, the output port of DUT 108 connects to an output port of the IC, while the input port of DUT 108 connects to an input port of the IC. In this configuration, the simulation architecture described herein is capable of simulating operation of DUT 108 in communication with one or more systems that are external to the IC in which DUT 108 is implemented (e.g., "off-chip" systems). In such cases, DUT 108 may communicate via channels 114 that simulate any of a variety of different communication channels such as Ethernet, PCIe, Universal Serial Bus (USB), or other type of communication channel.

In another aspect, the ports of DUT 108 are intended to connect to, or communicate with, other circuit blocks or systems that are implemented within the same IC in which DUT 108 is to be implemented. In that case, the output port of DUT 108 connects to an input port of another circuit block in the same IC (e.g., whether through one or more intervening circuit blocks) and the input port of DUT 108 connects to an output port of another circuit block in the same IC (e.g., also whether through one or more intervening circuit blocks). In this configuration, the simulation architecture described herein is capable of simulating operation of DUT 108 in communication with one or more systems that are within the IC in which DUT 108 is to be implemented (e.g., "on-chip" systems). Examples of on-chip connections that may be simulated by channels 114 include, but are not limited to, AXI memory mapped, AXI stream, or other on-chip interconnects such as cross-bars or on-chip communication buses.

Adapter 110 may be specified using a programming language such as SystemC. Adapter 110 is capable of communicating with DUT 108, e.g., as compiled for execution in simulator 104. Adapter 110 is capable of translating DUT compatible data output from DUT 108 and conveyed over channel 114-2 into HLPL transactions (e.g., outgoing HLPL transactions corresponding to a response) that may be provided to communication server 112. Similarly, adapter 110 is capable of translating HLPL transactions that may be received from communication server 112 (e.g., incoming HLPL transactions corresponding to data traffic) into DUT compatible data that may be conveyed over channel 114-1 to DUT 108. As discussed, the DUT compatible data may be HLPL transactions or HDL signals depending on the implementation of DUT 108. It should be appreciated that the particular adapter 110 and capabilities thereof may be selected to operate with the particular DUT 108, and language in which the DUT 108 is specified, that is simulated.

Communication server 112 may be specified in an HLPL such as C/C++. Communication server 112 may be implemented as a computer program executed by a data processing system, e.g., a computer, that communicates with one or more external computer programs. As defined within this disclosure, the term "external computer program" means a computer program that executes in a process, of a data processing system, that is separate and independent of a process in which the simulator and/or DUT execute. The external computer program may execute in the same or different data processing system as simulator 104 and DUT 108.

Communication server 112 is capable of sending the HLPL transactions received from adapter 110 to one or more computer programs executing external or outside of simulator 104. Similarly, communication server 112 is capable of providing HLPL transactions generated by the one or more computer programs executing external or outside of simulator 104 to adapter 110. In one aspect, communication server 112 is capable of communicating with such external computer programs by way of remote procedural calls (RPC) where the communication layer client 116 operates as a client and the communication server 112 operates as the server for the exchange. The exchange of data via RPC may be concurrency enabled. Referring to the example of FIG. 1A, communication server 112 may communicate with communication layer client 116 via RPC with concurrency enabled.

In the context of FIG. 1A, "concurrency enabled" means that multiple different ports may be implemented in simulator 104 that operate concurrently. These different ports are capable of communicating in parallel. In supporting multiple ports as described, multiple different adapters 110 may be implemented. Each different adapter may be coupled to a particular user circuit design (e.g., a different DUT or a larger DUT having multiple sets of ports for communicating over multiple sets of channels 114) and communicate via channels as described in connection with the example of FIG. 1A.

In using multiple adapters 110 operating in parallel, it should be appreciated that each adapter may be configured to communicate with an external computer program implemented in a same computer programming language or with an external computer program implemented in a different computer programming language.

Consider an example implementation where one or more DUTs within simulator 104 communicate with two or more adapters 110. In this example, each adapter 110 is configured to communicate in a same computer programming language such as Python or C++. That is, the transactions generated from HDL signals by the adapters are compliant with data structures utilized by the designated computer programming language which is the same across adapters.

In another example implementation where one or more DUTs within simulator 104 communicate with two or more adapters 110, the adapters 110 may be configured to communicate using two or more different computer programming languages. That is, a first adapter may be configured to communicate using Python, while a second adapter is configured to communicate using C++, etc. In this case, the transactions generated from HDL signals by the respective adapters are compliant with data structures utilized by the designated computer programming language for the respective adapters.

In cases where multiple adapters are coupled to communication server 112, communication server 112 is capable of routing HLPL transactions from the external computer programs to the correct adapter. Further, communication server 112 is capable of providing the HLPL transactions from the plurality of adapters to the correct external programs. Another example including multiple DUTS, adapters, communication layer clients, and external computer programs is illustrated in FIG. 1B.

Communication layer client 116 is capable of communicating with external computer program 118. As defined herein, the term "client" means a computer program executed by a data processing system that is configured to request services with a communication server executing as part of a computer-based simulation. The "client" executes in a process that is separate from the communication server. Communication layer client 116 may be implemented in a programming language that is specific to the particular type of programming language in which external computer program 118 is implemented. For purposes of illustration, in the case where external computer program 118 is implemented as a Python Interpreter capable of executing Python scripts, communication layer client 116 may be implemented as a Python communication layer client capable of communicating with the Python Interpreter. In the case where external computer program 118 is implemented as a C/C++ runtime, a SystemC runtime, or using an HDL such as Verilog, communication layer client 116 may be implemented as a C programming language communication layer client capable of communicating with the particular runtime or HDL.

Using a communication protocol such as RPC that facilitates communication across different processes and/or different computing systems allows a user to integrate existing models and/or program code used for traffic generation across multiple languages. The user need only utilize the particular communication layer client that is configured for use with the particular programming language in which external computer program 118 is implemented. The user's existing library of models capable of data traffic generation for testing circuit designs may be utilized in simulating DUT 108 regardless of the particular computer programming language (e.g., including scripting languages) in which the models is/are written. In this regard, the architecture described herein also facilitates re-use of the user's existing models.

Figure 1B:
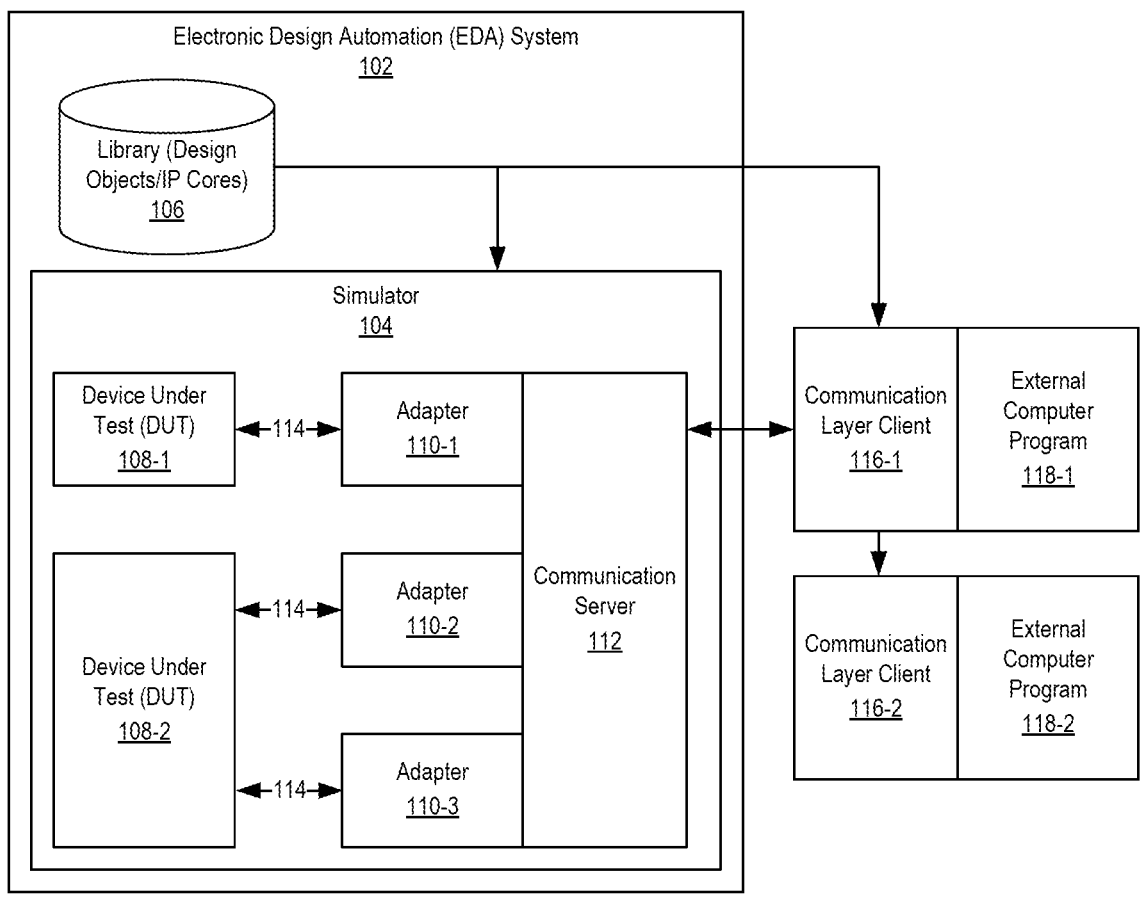
FIG. 1B illustrates another example of computer-based simulation environment.

FIG. 1B illustrates another example of computer-based simulation environment 100. In the example of FIG. 1B, simulator 104 includes a plurality of DUTS 108-1, 108-2. DUT 108-1 is coupled to adapter 110-1, which couples to communication server 112. DUT 108-2 communicates with communication server 112 via adapter 110-2 and adapter 110-3. Communication server 112 is in communication with communication layer 116-1 and external program 118-1, which may be configured to drive DUT 108-1. Communication server 112 is in communication with communication layer 116-2 and external program 118-2, which may be configured to drive DUT 108-2. Further, in the example of FIG. 1B, the communication channels are illustrated as bidirectional.

Figure 2:
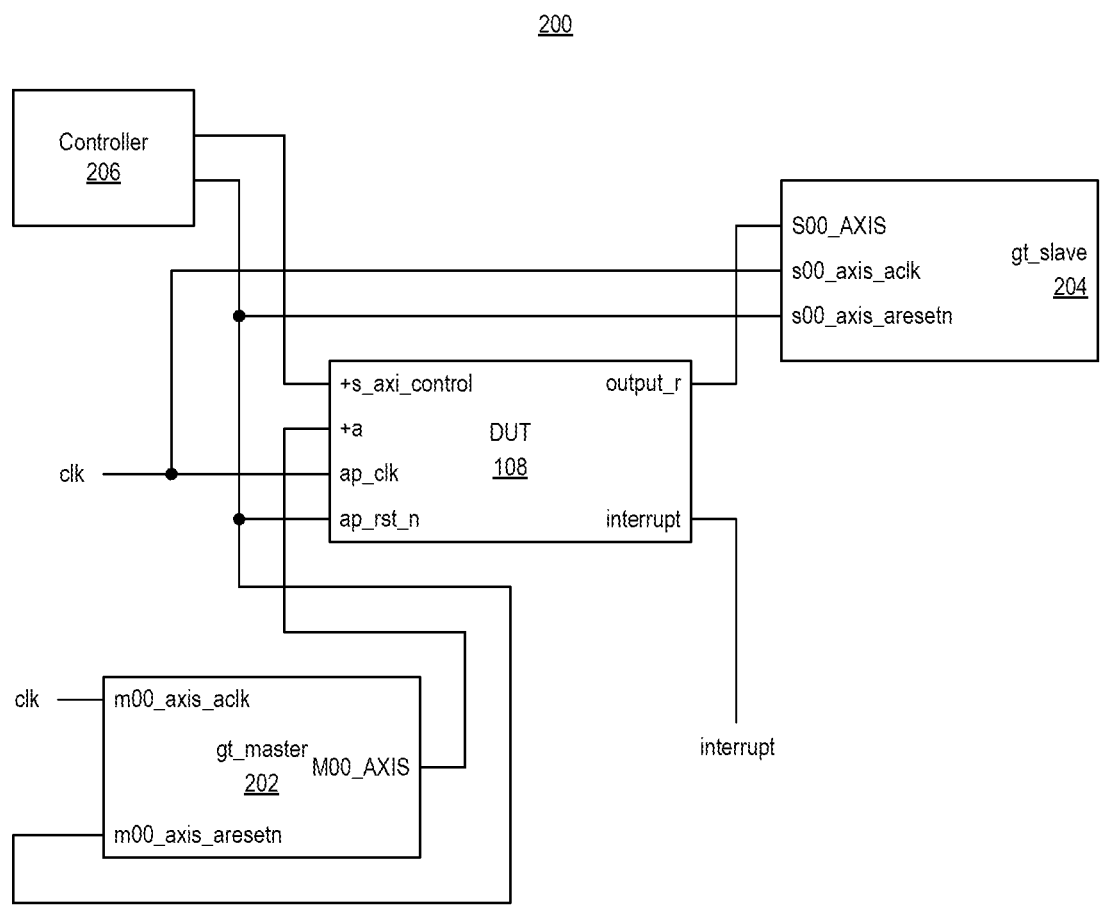
FIG. 2 illustrates an example block design including a Device Under Test (DUT) within a design environment of an Electronic Design Automation system.

FIG. 2 illustrates an example block design 200 including a DUT within a design environment of EDA system 102. In the example, adapter 108 is implemented as block 202 corresponding to "gt_master" and block 204 corresponding to "gt_slave." That is, blocks 202 and 204 may be instantiated in the design environment to facilitate an external computer program providing data traffic to DUT 108. Blocks 202 and 204, for example, may represent any of a variety of input/output systems capable of generating and consuming DUT compatible data. The DUT compatible data, for example, may be memory mapped or stream (AXI) formatted data. In the example of FIG. 2, within the block design environment provided by EDA system 102, blocks 202 and 204 represent the functionality of adapter 110 and communication server 112.

Block 202 is coupled to the data input "+a" of DUT 108. For example, the connection from the output of block 202 labeled as "M00_AXIS" to the data input of DUT 108 labeled "+a" corresponds to channel 114-1. Block 202 represents the functionality, in block design form within the design environment, of communication server 112 that receives HLPL transactions from external computer programs and adapter 110 that translates the HLPL transactions into DUT compatible data that is provided to DUT 108. Block 204 is coupled to the data output "output_r" of DUT 108. For example, the connection from the output of DUT 108 labeled as "output_r" to the input of block 204 labeled "S00_AXIS" corresponds to channel 114-2. Block 204 represents the functionality, in block design form within the design environment, of adapter 110 that translates DUT compatible data into HLPL transactions and communication server 112 that provides the HLPL transactions to one or more selected communication layer client(s).

Controller 206 may represent any of a variety of different circuit blocks intended to interact with DUT 108 and/or blocks 202, 204. In the example, controller 206 is capable of providing a control signal to DUT 108 and a reset signal to DUT 108, block 202, and block 204. The block design illustrated in FIG. 2 may include one or more other blocks that interact with and/or couple to DUT 108, controller 206, block 202, and/or block 204.

The computer program code of Example 1 is an example script that may be executed by, or as part of, external computer program 118 to generate data traffic that may be consumed by DUT 108 during a computer-based simulation.

Example 1 from xilinx_ xtlm import ipc_axis_master_util
from xilinx_xtlm import xtlm_ipc
Instantiating AXI Master Utilities
master_util=ipc_axis_master_util("gt_master")
Create payload payload=xtlm_ipc.axi_stream_packet( )
payload.data_length=4 #Data Length
payload.data="USER_DATA" #Data By User
payload.tlast=True #AXI Stream Fields
Send Transaction
master_util.b_transport(payload)

In Example 1, user provided program code may be used to connect to the instantiated architecture illustrated in FIGS. 1 and 2. In Example 1, the instantiated architecture, e.g., adapter 110 and communication server 112, represents and input and output of the IC in which DUT 108 is to be implemented. This allows external computer program 118, e.g., the above script as executed, to emulate any of a variety of different communication channels that may be included in the IC. For example, external computer program 118 may execute to emulate data flows provided over an Ethernet port, a USB port, a PCIe port, a High Definition Multimedia Interface (HDMI) port configured to convey video, other video port, audio port, data port, or the like. The functionality to mimic operation of a particular type of communication channel (e.g., physical port and corresponding communication protocols) and the data flows for that port are implemented by external computer program 118.

In creating external computer program 118, a user need only incorporate or use, the APIs provided by communication layer client 116. Communication layer client 116 provides APIs that facilitate communication with communication server 112. In an example implementation, the APIs are capable of receiving the data to be provided to DUT 108 and one or more parameters for conveying the data. The parameters may be interpreted or executed by adapter 110. For example, the parameters may include one or more parameters that specify inter-delay amounts for the data traffic that is being generated and provided to DUT 108.

The parameters provided from external computer program 118 in generating the data traffic reach adapter 110. Adapter 110 is capable of interpreting or executing the parameters received from external computer program 118 to generate the data traffic specified by external computer program 118. In executing the parameters, adapter 110 is capable of inserting any inter-delay amounts as specified. The inter-delay amounts specify an amount of delay that should be included between consecutive packets of data as provided to DUT 108.

The inter-delay amounts may be implemented by adapter 110 to provide inter-packet timing control. Adapter 110, for example, is capable of determining when a particular packet of data is sent to DUT 108 and guaranteeing that the next packet of data sent to DUT 108 is not sent prior to the specified inter-delay amount. The delay between packets may be more than is specified due to inter-process communications. Still, the inter-delay amount guarantees a minimum delay between consecutive packets of the data traffic.

The APIs provided by communication layer client 116 allow external computer program 118 to perform functions such as capturing a packet received in some particular format and replaying that data or packet to DUT 108. Users are able to emulate specific or exact situations encountered in real world situations with DUT 108 as if implemented in a physical device in the field. Prior mechanisms for simulation have relied on the DUT fetching data from a particular location (e.g., a memory model) and putting the data back (e.g., storing the data back to the memory model) as if the DUT were interacting with a RAM. The confines of the prior mechanisms prevented modeling of real-world situations encountered by DUT 108 in the field.

For example, external computer program 118 may be coded to include the logic necessary to determine the particular data to be sent, the formatting of the data, and the timing of the data. Moreover, external computer program 118 is capable of reacting to response data that is received from DUT 108. In other words, external computer program 118 may include logic that is capable of evaluating, e.g., parsing, response data received from DUT 108 and selecting one of a plurality of different programmatic actions or responses based on the response data received from DUT 108. Controlling timing and reacting to response data received from DUT 108 are not possible actions when using a conventional memory model for interacting with DUT 108.

In cases where multiple DUTs are simulated (e.g., multiple kernels or user circuit blocks), using the architecture illustrated in FIGS. 1A, 1B, and 2 allows an external computer program to interact with more than one DUT by routing particular HLPL transactions to each such DUT.

FIG. 3 is an example method 300 of computer-based simulation of a DUT corresponding to a user circuit design according to one or more embodiments of the present invention. In block 302, an adapter 110 is provided. Adapter 110 is configured to couple to DUT 108 during the computer-based simulation. Adapter 110 is configured to perform operations, during the simulation, such as translate incoming HLPL transactions into DUT compatible data for conveyance to DUT 108 over a first channel 114-1 and translate DUT compatible data generated by DUT 108 and conveyed from DUT 108 over a second channel 114-2 to outgoing HLPL transactions.

In one aspect, adapter 110 is configured to convert HLPL transactions compatible with the DUT into HLPL transactions for a selected computer programming language and convert HLPL transactions formatted for the selected computer programming language into HLPL transactions compatible with the DUT. The selected computer programming language may be the same as the computer programming language in which external computer program 118 is implemented or specified.

In another aspect, adapter 110 is configured to convert HDL signals to HLPL transactions for a selected computer programming language and convert HLPL transactions formatted for the selected computer programming language into HDL signals. The selected computer programming language may be the same as the computer programming language in which external computer program 118 is implemented or specified.

In block 304, a communication server 112 is provided. Communication server 112 couples to adapter 110 during the computer-based simulation. Communication server 112 is configured to exchange the incoming and outgoing HLPL transactions with one or more entities executing external to the computer-based simulation. For example, communication server 112 exchanges the incoming and outgoing HLPL transactions with communication layer client 116.

In block 306, communication layer client 116 is provided. Communication layer client 116 is configured to execute external to the computer-based simulation and exchange the incoming and outgoing HLPL transactions with communication server 112. For example, communication layer client 116 and external computer program 118 may execute in a process or processes that are different from the process in which simulator 104 executes. Communication layer client 116 provides an API through which external computer program 118 generates data traffic to drive DUT 108 within the computer-based simulation.

The foregoing and other implementations can each optionally include one or more of the following features, alone or in combination. Some example implementations include all the following features in combination.

In one aspect, adapter 110 is specified in a high-level HDL. An example of a high-level HDL is SystemC or another HLPL that includes constructs for expressing time as is the case with an HDL.

In another aspect, communication server 112 is specified in an HLPL.

In another aspect, communication server 112 communicates with communication layer client 116 via remote procedural calls.

In another aspect, the first channel represents an input port of an IC in which DUT 108 is to be implemented and the second channel represents an output port of the IC.

In another aspect, external computer program 118 emulates data traffic of a system that is external to the IC.

In another aspect, the first channel represents a first internal communication port of an IC in which DUT 108 is to be implemented and the second channel represents a second internal port of the IC.

In another aspect, external computer program 118 emulates data traffic of another circuit block implemented within the IC.

Figure 4:
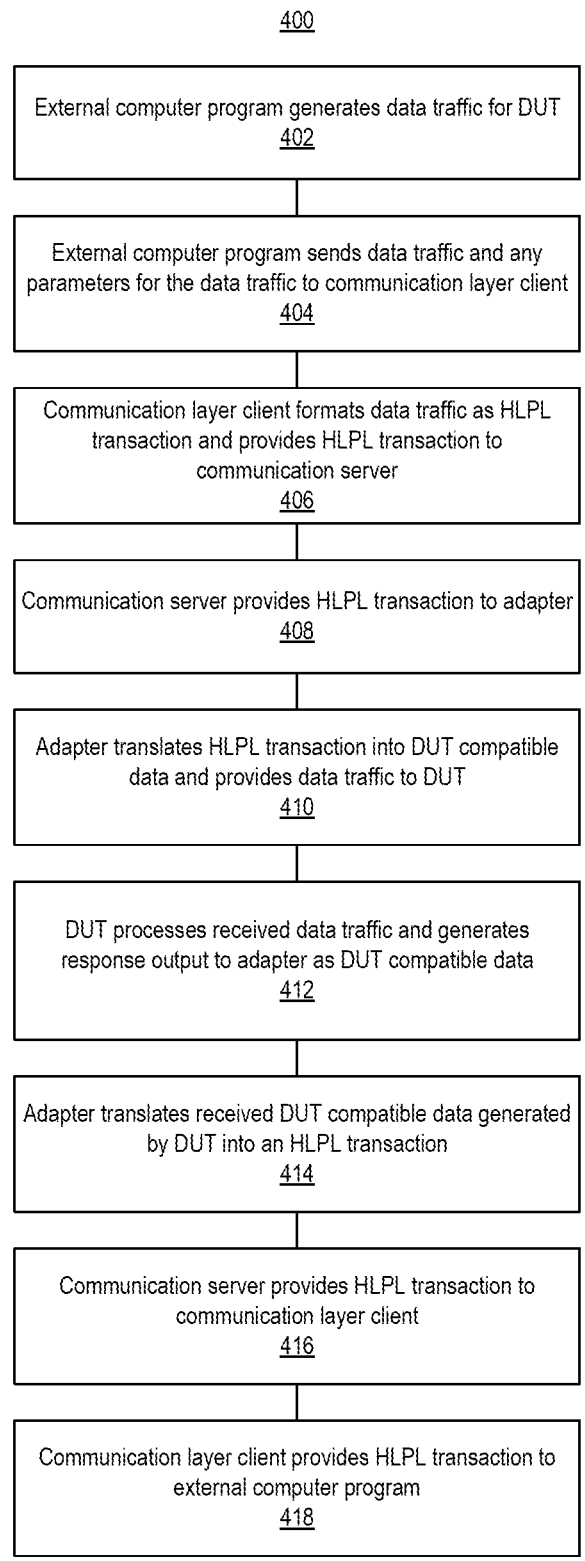
FIG. 4 is an example method of computer-based simulation of a DUT corresponding to a user circuit design according to one or more embodiments of the present invention.

FIG. 4 is an example method 400 of computer-based simulation of a DUT corresponding to a user circuit design according to one or more embodiments of the present invention. Method 400 may begin in a state where the system of FIG. 1 (e.g., FIG. 1A or 1B) is executed by one or more data processing systems. Within the system, the user has instantiated adapter 110, communication server 112, and communication layer client 116 which is in communication with an external computer program 118.

In block 402, external computer program 118 generates data traffic for DUT 108. The data traffic mimics the data (e.g., audio, video, protocols, timing, etc.) that would be sent from another internal circuit block in communication with DUT 108 or a system external to the IC in which DUT 108 is to be implemented. In block 404, external computer program 118 sends the data traffic and any parameters for the data traffic, e.g., inter-delay amounts, to communication layer client 116 by invoking the APIs provided by communication layer client 116. In block 406, communication layer client 116 is capable of formatting the received data traffic, inclusive of any parameters, into an HLPL transaction and provide the HLPL transaction to communication server 112. The HLPL transaction may be formatted or structured in compliance with the particular computer programming language in which external computer program 118 is implemented. Further, the HLPL transaction may be provided by way of RPCs.

In one example implementation, HLPL transactions may be formatted according to a communication protocol such as HLPL transactions is IEEE 1666 Standard for Standard System C Language Reference Manual. It should be appreciated that this standard is provided for purposes of illustration and not limitation. Other communication protocols may be used. In addition, communication server 112 and communication layer client 116 may be configured to utilize additional data formatting such as a protocol buffer that is configured to serialized structured data to generate a data stream and deserialized such data.

In block 408, communication server 112 provides the HLPL transaction to adapter 110. In block 410, adapter 110 translates the HLPL transaction into DUT compatible data (e.g., HDL signals or HLPL transactions depending on the type of model of the DUT) and provides the data traffic so formatted to DUT 108. Further, adapter 110 provides the data traffic to DUT 108 in compliance with, e.g., while observing, any inter-delay amounts specified by external computer program 118 for the data traffic. That is, adapter 110 inserts any delays between consecutive packets sent to DUT 108 as specified by the parameters of the data traffic generated by external computer program 118.

In block 412, DUT 108 is capable of processing the received data traffic and generating a response that is output to adapter 110 as DUT compatible data. In block 414, adapter 110 translates the received DUT compatible data into an HLPL transaction. The HLPL transaction may be formatted or structured in compliance with the particular computer programming language in which external computer program 118 is implemented. In block 416, communication server 112 provides the HLPL transaction to communication layer client 116. The HLPL transaction may be provided to communication layer client 116 using RPCs. In block 418, communication layer client 116 provides the HLPL transaction to external computer program 118. Communication layer client 116 may provide the HLPL transaction to external computer program 118 using the previously mentioned APIs.

Having received the response from DUT 108, external computer program 118 is capable of parsing the received HLPL transaction (e.g., the response data) and reacting to the content thereof based on the logic implemented by external computer program 118. Accordingly, external computer program 118 is capable of responding in any of a variety of ways that are dependent on the particular data and/or timing of data received from DUT 108.

Figure 5:
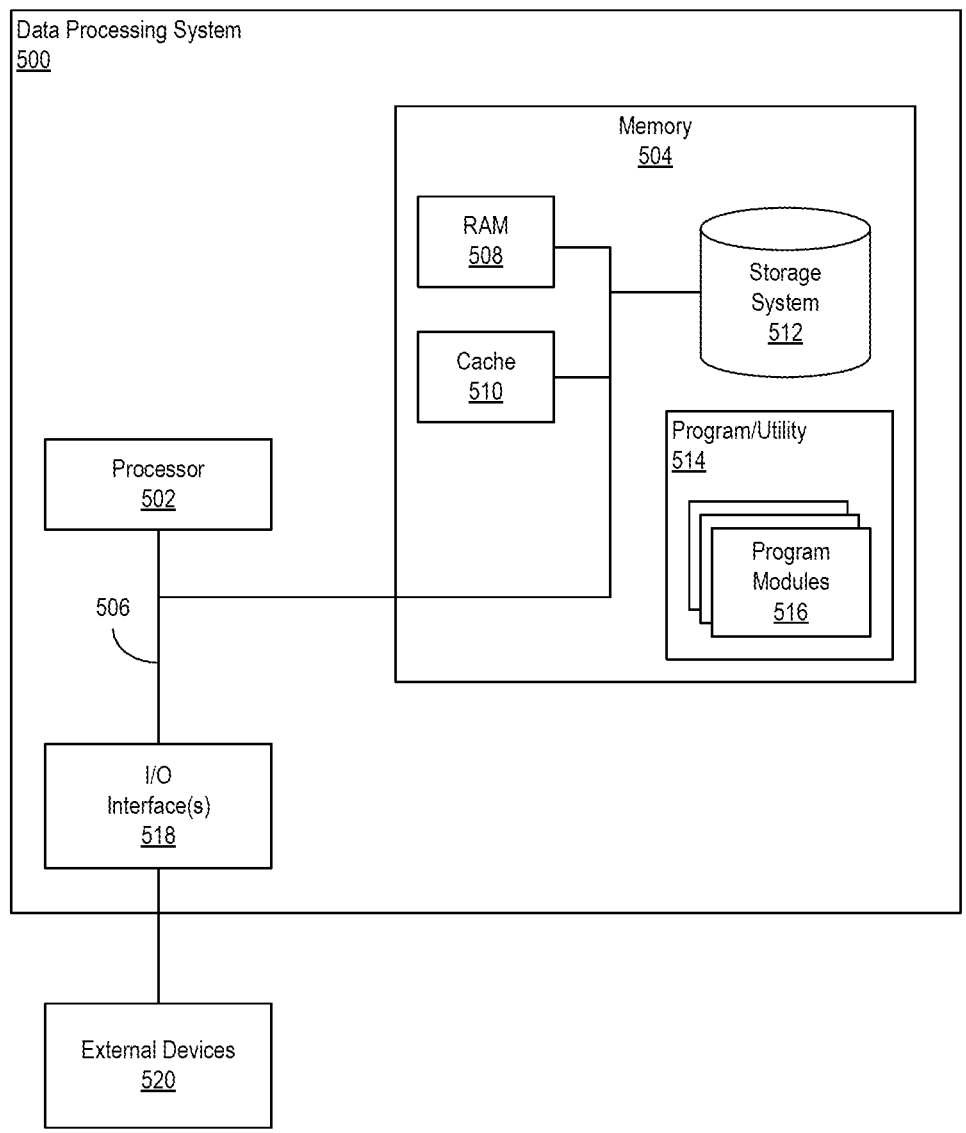
FIG. 5 illustrates an example implementation of a data processing system for use with one or more embodiments of the present invention.

FIG. 5 illustrates an example implementation of a data processing system 500. The components of data processing system 500 can include, but are not limited to, a processor 502, a memory 504, and a bus 506 that couples various system components including memory 504 to processor 502. Processor 502 may be implemented as one or more processors. In an example, processor 502 is implemented as a central processing unit (CPU). Example processor types include, but are not limited to, processors having an x86 type of architecture (IA-32, IA-64,etc.), Power Architecture, ARM processors, and the like.

Bus 506 represents one or more of any of a variety of communication bus structures. By way of example, and not limitation, bus 506 may be implemented as a Peripheral Component Interconnect Express (PCIe) bus. Data processing system 500 typically includes a variety of computer system readable media. Such media may include computer-readable volatile and non-volatile media and computer-readable removable and non-removable media.

Memory 504 can include computer-readable media in the form of volatile memory, such as random-access memory (RAM) 508 and/or cache memory 510. Data processing system 500 also can include other removable/non-removable, volatile/non-volatile computer storage media. By way of example, storage system 512 can be provided for reading from and writing to a non-removable, non-volatile magnetic and/or solid-state media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 506 by one or more data media interfaces. Memory 504 is an example of at least one computer program product.

Program/utility 514, having a set (at least one) of program modules 516, may be stored in memory 504. Program/utility 514 is executable by processor 502. By way of example, program modules 516 may represent an operating system, one or more application programs, other program modules, and program data. Program modules 516, upon execution, cause data processing system 500, e.g., processor 502, to carry out the functions and/or methodologies of the example implementations described within this disclosure. For example, one or more program modules 516 may implement the architecture described herein in connection with FIGS. 1A, 1B, and 2 and/or perform the one or more or all of the blocks of the methods described in connection with FIGS. 3 and/or 4. Program/utility 514 and any data items used, generated, and/or operated upon by data processing system 500 are functional data structures that impart functionality when employed by data processing system 500.

Data processing system 500 may include one or more Input/Output (I/O) interfaces 518 communicatively linked to bus 506. I/O interface(s) 518 allow data processing system 500 to communicate with one or more external devices 520 and/or communicate over one or more networks such as a local area network (LAN), a wide area network (WAN), and/or a public network (e.g., the Internet). Examples of I/O interfaces 518 may include, but are not limited to, network cards, modems, network adapters, hardware controllers, etc. Examples of external devices also may include devices that allow a user to interact with data processing system 500 (e.g., a display, a keyboard, and/or a pointing device) and/or other devices such as accelerator card having an IC disposed thereon. The IC is capable of implementing DUT 108 therein as described herein.

Data processing system 500 is only one example implementation. Data processing system 500 can be practiced as a standalone device (e.g., as a user computing device or a server, as a bare metal server), in a cluster (e.g., two or more interconnected computers), or in a distributed cloud computing environment (e.g., as a cloud computing node) where tasks are performed by remote processing devices that are linked through a communications network. In a distributed cloud computing environment, program modules may be located in both local and remote computer system storage media including memory storage devices. The example of FIG. 5 is not intended to suggest any limitation as to the scope of use or functionality of example implementations described herein. A data processing system is an example of computer hardware that is capable of performing the various operations described within this disclosure.

In this regard, data processing system 500 may include fewer components than shown or additional components not illustrated in FIG. 5 depending upon the particular type of device and/or system that is implemented. The particular operating system and/or application(s) included may vary according to device and/or system type as may the types of I/O devices included. Further, one or more of the illustrative components may be incorporated into, or otherwise form a portion of, another component. For example, a processor may include at least some memory.

Data processing system 500 may be operational with numerous other general-purpose or special-purpose computing system environments or configurations. Examples of computing systems, environments, and/or configurations that may be suitable for use with data processing system 500 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Some computing environments, e.g., cloud computing environments and/or edge computing environments using data processing system 500 or other suitable data processing system, generally support the FPGA-as-a-Service (FaaS) model. In the FaaS model, user functions are hardware accelerated as circuit designs implemented within programmable ICs operating under control of the (host) data processing system. Other examples of cloud computing models are described in the National Institute of Standards and Technology (NIST) and, more particularly, the Information Technology Laboratory of NIST.

Program modules 516 also may include software that is capable of performing an implementation flow on a circuit design or portion thereof. In this regard, data processing system 500 serves as an example of one or more EDA tools or a system that is capable of processing circuit designs through a design flow.

Figure 6:
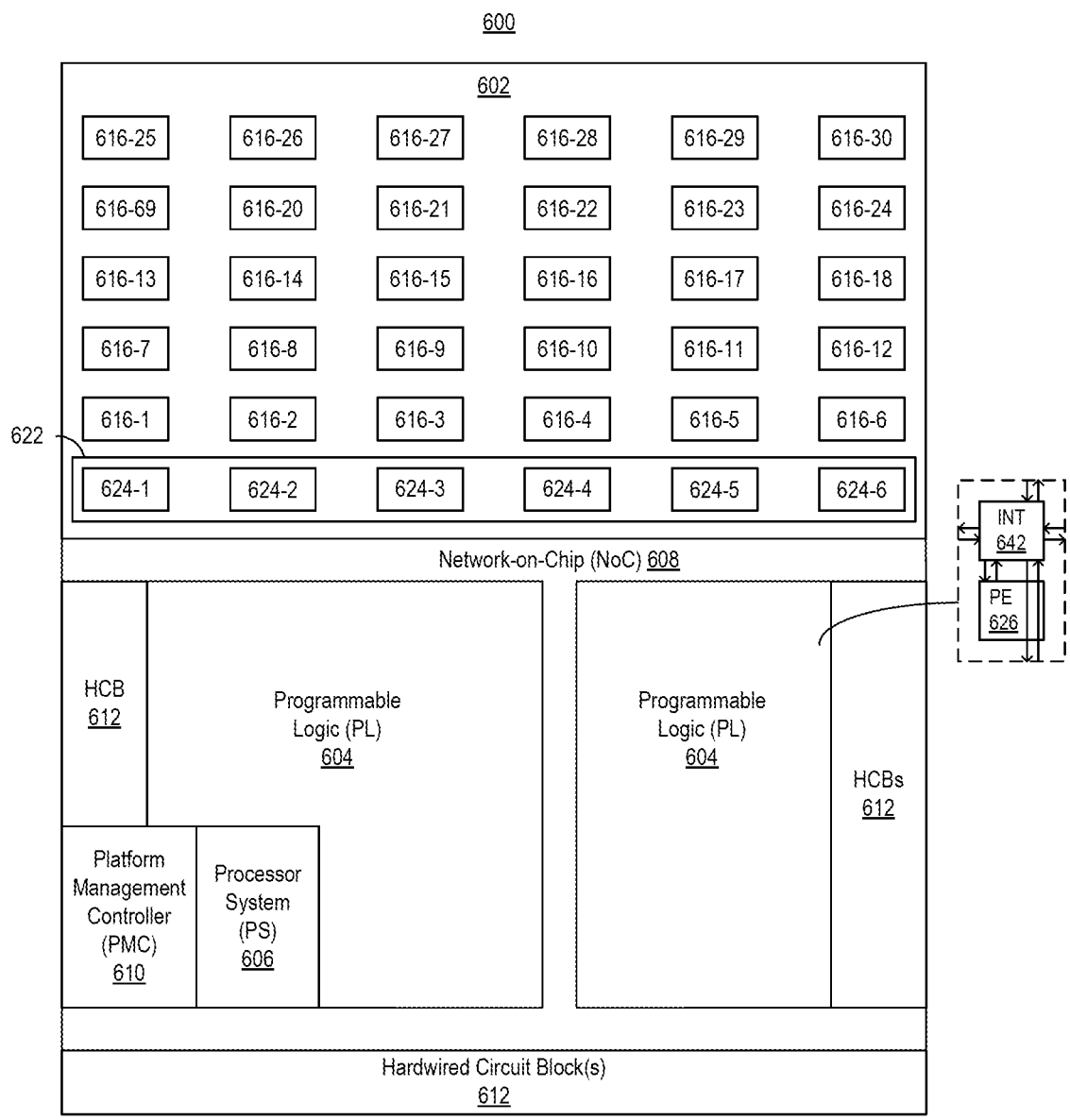
FIG. 6 illustrates an example architecture for an integrated circuit in which a DUT may be implemented in accordance with one or more embodiments of the present invention.

FIG. 6 illustrates an example architecture 600 for an IC. Architecture 600 may be used to implement a programmable IC, an adaptive system, and/or a System-on-Chip (SoC). In the example of FIG. 6, architecture 600 is implemented on a single die provided within a single package. In other examples, architecture 600 may be implemented using a plurality of interconnected dies within a single package where the various resources of architecture 600 (e.g., circuits) illustrated in FIG. 6 are implemented across the different interconnected dies.

In the example, architecture 600 includes a plurality of different subsystems including a data processing array 602, programmable logic (PL) 604, a processor system (PS) 606, a Network-on-Chip (NoC) 608, a platform management controller (PMC) 610, and one or more hardwired circuit blocks 612.

Data processing array 602 is implemented as a plurality of interconnected and programmable compute tiles 616. Compute tiles 616 may be arranged in an array and are hardwired. Each compute tile 616 can include one or more cores and a memory module. In one example implementation, cores of compute tiles 616 may be implemented as custom circuits that do not execute program code.

In another example implementation, cores of compute tiles 616 are capable of executing program code stored in core-specific program memories contained within each respective core. As an example, a core of a compute tile 616 may be implemented as a vector processor capable of performing both fixed and floating-point operations and/or a scalar processor. Each compute tile 616 further includes a data memory (e.g., the memory module) and dedicated multi-bit data movement channels connecting the compute tiles 616. Each compute tile 616 further can include support for direct memory access (DMA) operations and locks to move data to and from other compute tiles 616. In one or more other example implementations, data processing array 602 may include one or more memory tiles that replace one or more of the compute tiles 616.

Data processing array 602 may be configured to form a plurality of clusters, where each cluster includes one or more compute tiles 616 and/or memory tiles. Compute tiles 616 and/or memory tiles in a same cluster may communicate with one another to implement a particular application or accelerator. Clusters may operate in isolation from one another where each different cluster (e.g., accelerator) is capable of running a cluster-specific application (or different instance of an application run in another cluster). Each cluster operates as part of a domain of architecture 600.

It should be appreciated that the number of tiles, whether compute or memory, illustrated in FIG. 6 is for purposes of illustration. Data processing array 602 may include more tiles than shown where data processing array 602 includes more rows of tiles and/or more columns of tiles. For example, in some cases, data processing array 602 may include hundreds of tiles. In other examples, data processing array 602 may include fewer tiles than shown in FIG. 6.

Data processing array 602 includes an interface block 622 that connects tiles 616 or memory tiles to other resources of architecture 600. In the example of FIG. 6, interface block 622 includes a plurality of interconnected interface tiles 624 organized in a row. In one example, each of interface tiles 624 may have a same architecture. In another example, interface tiles 624 may be implemented with different architectures where each different interface tile architecture supports communication with different types of resources of architecture 600. Interface tiles 624 are connected so that data may be propagated from one interface tile 624 to another bi-directionally. Each interface tile 624 is capable of operating as an interface for the column of compute tiles 616 and/or memory tiles directly above.

PL 604 is circuitry that may be programmed to perform specified functions. As an example, PL 604 may be implemented as field programmable gate array type of circuitry. PL 604 can include an array of programmable circuit blocks. As defined herein, the term "programmable logic" means circuitry used to build reconfigurable digital circuits. Programmable logic is formed of many programmable circuit blocks that provide basic functionality. The topology of PL 604 is highly configurable unlike hardwired circuitry. In one aspect, each programmable circuit block of PL 604 includes a programmable element 626 (e.g., a functional element) and a programmable interconnect 642. The programmable interconnects 642 provide the highly configurable topology of PL 604. The programmable interconnects 642 may be configured on a per wire basis to provide connectivity among the programmable elements 626 of programmable circuit blocks of PL 604 and is configurable on a per-bit basis (e.g., where each wire conveys a single bit of information) unlike connectivity among compute tiles 616 and/or memory tiles in data processing array 602, for example.

Examples of programmable circuit blocks of PL 604 include configurable logic blocks having look-up tables and registers. Unlike hardwired circuitry described below and sometimes referred to as hardwired circuit blocks, these programmable circuit blocks have an undefined function at the time of manufacture. PL 604 may include other types of programmable circuit blocks that also provide basic and defined functionality with more limited programmability. Examples of these circuit blocks may include digital signal processing blocks (DSPs), phase lock loops (PLLs), and block random access memories (BRAMs). These types of programmable circuit blocks, like others in PL 604, are numerous and intermingled with the other programmable circuit blocks of PL 604. These circuit blocks may also have an architecture that generally includes a programmable interconnect 642 and a programmable element 626 and, as such, are part of the highly configurable topology of PL 604.

Prior to use, PL 604, e.g., the programmable interconnect and the programmable elements, must be programmed or "configured" by loading data referred to as a configuration bitstream into internal configuration memory cells therein. The configuration memory cells, once loaded with a configuration bitstream, define how PL 604 is configured, e.g., the topology, and operates (e.g., particular functions performed). Within this disclosure, a "configuration bitstream" is not equivalent to program code executable by a processor or computer.

PS 606 is implemented as hardwired circuitry that is fabricated as part of architecture 600. PS 606 may be implemented as, or include, any of a variety of different processor types each capable of executing program code. For example, PS 606 may be implemented as an individual processor, e.g., a single core capable of executing program code. In another example, PS 606 may be implemented as a multi-core processor. In still another example, PS 606 may include one or more cores, modules, co-processors, I/O interfaces, and/or other resources. PS 606 may be implemented using any of a variety of different types of architectures. Example architectures that may be used to implement PS 606 may include, but are not limited to, an ARM processor architecture, an x86 processor architecture, a graphics processing unit (GPU) architecture, a mobile processor architecture, a DSP architecture, combinations of the foregoing architectures, or other suitable architecture that is capable of executing computer-readable instructions or program code.

NoC 608 is a programmable interconnecting network for sharing data between endpoint circuits in architecture 600. The endpoint circuits can be disposed in DPE array 602, PL 604, PS 606, and/or selected hardwired circuit blocks 612. NoC 608 can include high-speed data paths with dedicated switching. In an example, NoC 608 includes one or more horizontal paths, one or more vertical paths, or both horizontal and vertical path(s). The arrangement and number of regions shown in FIG. 6 is merely an example. NoC 608 is an example of the common infrastructure that is available within architecture 600 to connect selected components and/or subsystems.

Nets that are to be routed through NoC 608 are unknown until a design is created for implementation within architecture 600. NoC 608 may be programmed by loading configuration data into internal configuration registers that define how elements within NoC 608 such as switches and interfaces are configured and operate to pass data from switch to switch and among the NoC interfaces to connect the endpoint circuits. NoC 608 is fabricated as part of architecture 600 (e.g., is hardwired) and, while not physically modifiable, may be programmed to establish connectivity between different master circuits and different slave circuits of a user circuit design. NoC 608, upon power-on, does not implement any data paths or routes therein. Once configured by a master circuit such as PMC 610, however, NoC 608 implements data paths or routes between endpoint circuits.

PMC 610 is responsible for managing architecture 600. PMC 610 is a subsystem within architecture 600 that is capable of managing the other programmable circuit resources across the entirety of architecture 600. PMC 610 is capable of maintaining a safe and secure environment, booting architecture 600, and managing architecture 600 during normal operations. For example, PMC 610 is capable of providing unified and programmable control over power-up, boot/configuration, security, power management, safety monitoring, debugging, and/or error handling for the different subsystems of architecture 600 (e.g., DPE array 602, PL 604, PS 606, and NoC 608). PMC 610 operates as a dedicated platform manager that decouples PS 606 and from PL 604. As such, PS 606 and PL 604 may be managed, configured, and/or powered on and/or off independently of one another.

In one aspect, PMC 610 is capable of operating as a Root-of-Trust for the entirety of architecture 600. As an example, PMC 610 is responsible for authenticating and/or validating device images containing configuration data that may be loaded into architecture 600 for any of the programmable resources of architecture 600. PMC 610 further is capable of protecting architecture 600 against tampering during operation. By operating as the Root-of-Trust for architecture 600, PMC 610 is capable of monitoring operation of PL 604, PS 606, and/or any other programmable circuit resources that may be included in architecture 600. The Root-of-Trust capabilities, as performed by PMC 610, are distinct and separate from PS 606 and PL 604 and/or any operations performed by the PS 606 and/or PL 604.

In one aspect, PMC 610 may be implemented as a processor with dedicated resources. PMC 610 may include multiple redundant processors. The processors of PMC 610 are capable of executing firmware. Use of firmware supports configurability and segmentation of global features of architecture 600 such as reset, clocking, and protection to provide flexibility in creating separate domains (which are distinct from "power domains" that may be subsystem-specific).

Hardwired circuit blocks 612 are special-purpose circuit blocks fabricated as part of architecture 600. Though hardwired, hardwired circuit blocks 612 may be configured by loading configuration data into control registers to implement one or more different modes of operation. Examples of hardwired circuit blocks 612 may include input/output (I/O) blocks, transceivers for sending and receiving signals to circuits and/or systems external to architecture 600, memory controllers, or the like. Examples of different I/O blocks may include single-ended and pseudo differential I/Os. Examples of transceivers may include high-speed differentially clocked transceivers. Other examples of hardwired circuit blocks 612 include, but are not limited to, cryptographic engines, digital-to-analog converters (DACs), analog-to-digital converters (ADCs), and the like. In general, hardwired circuit blocks 612 are application-specific circuit blocks.

The various programmable circuit resources illustrated in FIG. 6 may be programmed initially as part of a boot process for architecture 600. During runtime, the programmable circuit resources may be reconfigured. In one aspect, PMC 610 is capable of initially configuring DPE array 602, PL 604, PS 606, and NoC 608. At any point during runtime, PMC 610 may reconfigure all or a portion of architecture 600. In some cases, PS 606 may configure and/or reconfigure PL 604 and/or NoC 608 once initially configured by PMC 610.

Referring to FIGS. 1 and 6 in combination, in one or more aspects, DUT 108 may represent a user circuit design intended to be implemented in PL 604, in data processing array 602, or in PS 606. A circuit design to be implemented in PL 604, for example, may be represented as an HDL model that communicates during simulation using HDL signals or a transaction level model that communicates during simulation via HLPL transactions. A circuit design intended for implementation in data processing array 602 may include executable program code (e.g., HLPL program code intended for execution by individual ones of the compute tiles 616) and communicate by way of HLPL transactions during simulation. In this regard, external computer program 118 may be implemented to emulate another circuit also implemented in the IC such as one implemented in PL 604, processing array 602, PS 606, and/or a hardwired circuit block 612. In other example implementations, the external computer program 118 may represent a circuit and/or system that is off-chip, e.g., external to the IC. The circuit and/or system may be located on an accelerator card with the IC or may be located remote from the accelerator card on which the IC is disposed.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

As defined herein, the singular forms "a," "an," and "the" are intended to include the plural forms as well, unless the context clearly indicates otherwise.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without human intervention. As defined herein, the term "user" means a human being.

As used herein, the term "cloud computing" refers to a computing model that facilitates convenient, on-demand network access to a shared pool of configurable computing resources such as networks, servers, storage, applications, ICs (e.g., programmable ICs) and/or services. These computing resources may be rapidly provisioned and released with minimal management effort or service provider interaction. Cloud computing promotes availability and may be characterized by on-demand self-service, broad network access, resource pooling, rapid elasticity, and measured service.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. The various forms of memory, as described herein, are examples of computer readable storage media. A non-exhaustive list of more specific examples of a computer readable storage medium may include: a portable computer diskette, a hard disk, a RAM, a read-only memory (ROM), an erasable programmable read-only memory (EPROM or Flash memory), an electronically erasable programmable read-only memory (EEPROM), a static random-access memory (SRAM), a portable compact disc read-only memory (CD-ROM), a digital versatile disk (DVD), a memory stick, a floppy disk, or the like.

As defined within this disclosure, the term "data structure" means a physical implementation of a data model's organization of data within a physical memory. As such, a data structure is formed of specific electrical or magnetic structural elements in a memory. A data structure imposes physical organization on the data stored in the memory as used by an application program executed using a processor.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, "data processing system" means one or more hardware systems configured to process data, each hardware system including at least one processor programmed to initiate operations and memory.

As defined herein, the term "processor" means at least one circuit capable of carrying out instructions contained in program code. The circuit may be an integrated circuit or embedded in an integrated circuit.

As defined herein, the term "output" means storing in physical memory elements, e.g., devices, writing to display or other peripheral output device, sending or transmitting to another system, exporting, or the like.

As defined herein, the term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc. may be used herein to describe various elements. These elements should not be limited by these terms, as these terms are only used to distinguish one element from another unless stated otherwise or the context clearly indicates otherwise.

A computer program product may include a computer readable storage medium (or media) having computer readable program instructions thereon for causing a processor to carry out aspects of the inventive arrangements described herein. Within this disclosure, the term "program code" is used interchangeably with the term "computer readable program instructions." Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object oriented programming language and/or procedural programming languages. Computer readable program instructions may include state-setting data. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a computer, special-purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

In another aspect, a system having a processor is capable of initiating and/or performing the various operations described within this disclosure. In still another aspect, a computer program product includes one or more computer readable storage media, and program instructions collectively stored on the one or more computer readable storage media, wherein the program instructions are executable by computer hardware to initiate the various operations described within this disclosure.

What is claimed is:

1. A method of computer-based simulation of a device under test (DUT) corresponding to a user circuit design, the method comprising:
providing an adapter configured to couple to the DUT during the computer-based simulation, wherein the adapter is configured to:
translate incoming high-level programming language (HLPL) transactions into DUT compatible data for conveyance to the DUT over a first channel; and
translate DUT compatible data generated by the DUT and conveyed from the DUT over a second channel to outgoing HLPL transactions;
providing a communication server that couples to the adapter during the computer-based simulation, wherein the communication server is configured to exchange the incoming and outgoing HLPL transactions with one or more entities executing external to the computer-based simulation; and
providing a communication layer client configured to execute external to the computer-based simulation and exchange the incoming and outgoing HLPL transactions with the communication server, wherein the communication layer client provides an application programming interface through which an external computer program generates data traffic to drive the DUT within the computer-based simulation.

2. The method of claim 1, wherein the adapter is specified in a high-level hardware description language.

3. The method of claim 1, wherein the communication server is specified in a HLPL.

4. The method of claim 1, wherein the communication server communicates with the communication layer client via remote procedural calls.

5. The method of claim 1, wherein the first channel represents an input port of an integrated circuit in which the DUT is to be implemented and the second channel represents an output port of the integrated circuit.

6. The method of claim 5, wherein the external computer program emulates data traffic of a system that is external to the integrated circuit.

7. The method of claim 1, wherein the first channel represents a first internal communication port of an integrated circuit in which the DUT is to be implemented and the second channel represents a second internal port of the integrated circuit.

8. The method of claim 7, wherein the external computer program emulates data traffic of another circuit block implemented within the integrated circuit.

9. The method of claim 1, wherein the DUT compatible data are hardware description language signals.

10. The method of claim 1, wherein the DUT compatible data are HLPL transactions.

11. The method of claim 1, wherein the external computer program is a simulation process that executes independently of the simulation including the DUT.

12. A system for computer-based simulation of a device under test (DUT) corresponding to a user circuit design, the system comprising:
one or more processors configured to initiate operations including:
executing an adapter configured to couple to the DUT during the computer-based simulation, wherein the adapter is configured to:
translate incoming high-level programming language (HLPL) transactions into DUT compatible data for conveyance to the DUT over a first channel; and
translate DUT compatible data generated by the DUT and conveyed from the DUT over a second channel to outgoing HLPL transactions;
executing a communication server that couples to the adapter during the computer-based simulation, wherein the communication server is configured to exchange the incoming and outgoing HLPL transactions with one or more entities executing external to the computer-based simulation; and
executing a communication layer client external to the computer-based simulation, wherein the communication layer client is configured to exchange the incoming and outgoing HLPL transactions with the communication server and provide an application programming interface through which an external computer program generates data traffic to drive the DUT within the computer-based simulation.

13. The system of claim 12, wherein the adapter is specified in a high-level hardware description language.

14. The system of claim 12, wherein the communication server is specified in a HLPL.

15. The system of claim 12, wherein the communication server communicates with the communication layer client via remote procedural calls.

16. The system of claim 12, wherein the first channel represents an input port of an integrated circuit in which the DUT is to be implemented and the second channel represents an output port of the integrated circuit.

17. The system of claim 12, wherein the first channel represents a first internal communication port of an integrated circuit in which the DUT is to be implemented and the second channel represents a second internal port of the integrated circuit.

18. The system of claim 12, wherein the DUT compatible data are hardware description language signals.

19. The system of claim 12, wherein the DUT compatible data are HLPL transactions.

20. A computer program product, comprising:
one or more computer readable storage media, and program instructions collectively stored on the one or more computer readable storage media, wherein the program instructions are executable by computer hardware to initiate operations including:
implementing an adapter configured to couple to a device under test (DUT) during a computer-based simulation, wherein the adapter is configured to:
translate incoming high-level programming language (HLPL) transactions into DUT compatible data for conveyance to the DUT over a first channel; and
translate DUT compatible data generated by the DUT and conveyed from the DUT over a second stream channel to outgoing HLPL transactions;
implementing a communication server that couples to the adapter during the computer-based simulation, wherein the communication server is configured to exchange the incoming and outgoing HLPL transactions with one or more entities executing external to the computer-based simulation; and
implementing a communication layer client external to the computer-based simulation, wherein the communication layer client is configured to exchange the incoming and outgoing HLPL transactions with the communication server and provide an application programming interface through which an external computer program generates data traffic to drive the DUT within the computer-based simulation.

* * * * *